US012622004B2

(12) United States Patent
Kuo

(10) Patent No.: US 12,622,004 B2
(45) Date of Patent: *May 5, 2026

(54) SEMICONDUCTOR TRENCH CAPACITOR STRUCTURE AND MANUFACTURING METHOD THEREOF

(71) Applicant: TAIWAN SEMICONDUCTOR MANUFACTURING COMPANY LTD., Hsinchu (TW)

(72) Inventor: Fu-Chiang Kuo, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 15 days.

This patent is subject to a terminal disclaimer.

(21) Appl. No.: 18/779,095

(22) Filed: Jul. 22, 2024

(65) Prior Publication Data

US 2024/0372014 A1     Nov. 7, 2024

Related U.S. Application Data

(63) Continuation of application No. 18/327,869, filed on Jun. 1, 2023, now Pat. No. 12,119,414, which is a
(Continued)

(51) Int. Cl.
*H10D 1/66*          (2025.01)
*H01L 21/762*      (2006.01)
(Continued)

(52) U.S. Cl.
CPC ....... *H10D 1/665* (2025.01); *H01L 21/76229* (2013.01); *H10B 12/038* (2023.02);
(Continued)

(58) Field of Classification Search
CPC .......... H10D 1/711–712; H10D 1/665; H10D 1/696; H10D 1/047; H10B 12/038; H10B 12/0387; H10B 12/34
See application file for complete search history.

(56) References Cited

U.S. PATENT DOCUMENTS

| | | | | |
|---|---|---|---|---|
| 12,119,414 B2 * | 10/2024 | Kuo | .......................... | H10D 1/68 |
| 2012/0199949 A1 * | 8/2012 | Lan | .......................... | H01G 4/10 |
| | | | | 438/386 |
| 2021/0226001 A1 * | 7/2021 | Nishita | ................... | H10D 1/696 |

FOREIGN PATENT DOCUMENTS

| | | | | |
|---|---|---|---|---|
| FR | 2894066 A1 * | 6/2007 | ............. | H10D 1/711 |

OTHER PUBLICATIONS

FR 2894066 A, English Machine Translation (Year: 2025).*

* cited by examiner

*Primary Examiner* — Jose R Diaz
(74) *Attorney, Agent, or Firm* — WPAT LAW; Anthony King

(57)          ABSTRACT

A semiconductor trench capacitor structure is provided. The semiconductor trench capacitor comprises a semiconductor substrate; a trench capacitor overlying the semiconductor substrate, wherein the trench capacitor comprises a plurality of trench electrodes and a plurality of capacitor dielectric layers that are alternatingly stacked over the semiconductor substrate and defines a plurality of trench segments and a plurality of pillar segments, wherein the trench electrodes and the capacitor dielectric layers are recessed into the semiconductor substrate at the trench segments, and wherein the trench segments are separated from each other by the pillar segments; and a protection dielectric layer disposed between the semiconductor substrate and the trench capacitor, wherein the protection dielectric layer has a thickness greater than thicknesses of the trench electrodes.

20 Claims, 11 Drawing Sheets

Related U.S. Application Data continuation of application No. 17/461,734, filed on
Aug. 30, 2021, now Pat. No. 11,817,510.

(51) Int. Cl.
   *H10B 12/00*        (2023.01)
   *H10D 1/00*         (2025.01)
   *H10D 1/68*         (2025.01)

(52) U.S. Cl.
   CPC ............. *H10D 1/042* (2025.01); *H10D 1/047*
       (2025.01); *H10D 1/68* (2025.01); *H10D 1/696*
                (2025.01); *H10D 1/716* (2025.01)

204

212a
208a

204

206

214

208a
212b

202

200

Figure 8:
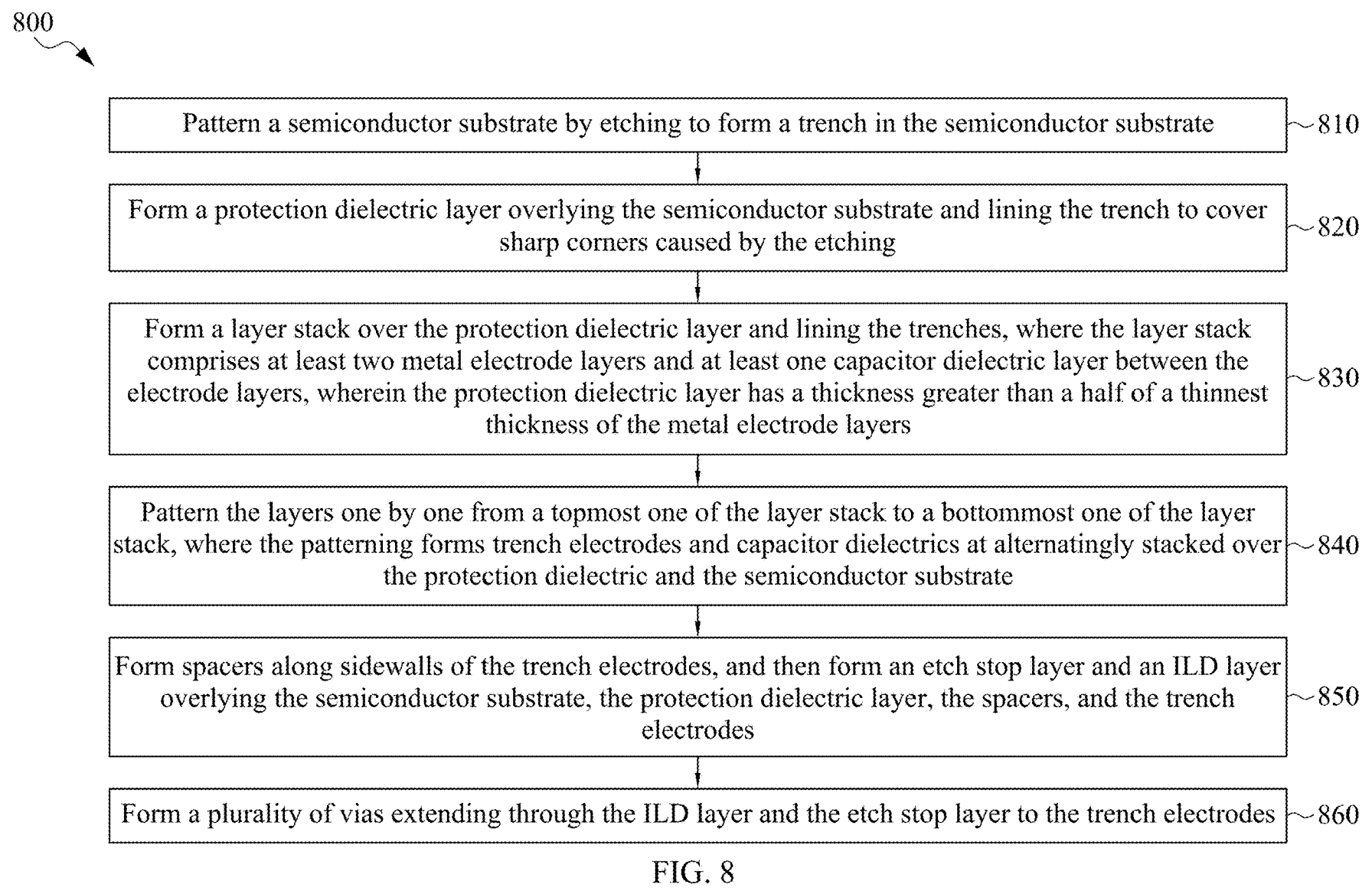

810 — Pattern a semiconductor substrate by etching to form a trench in the semiconductor substrate 820 — Form a protection dielectric layer overlying the semiconductor substrate and lining the trench to cover sharp corners caused by the etching 830 — Form a layer stack over the protection dielectric layer and lining the trenches, where the layer stack comprises at least two metal electrode layers and at least one capacitor dielectric layer between the electrode layers, wherein the protection dielectric layer has a thickness greater than a half of a thinnest thickness of the metal electrode layers 840 — Pattern the layers one by one from a topmost one of the layer stack to a bottommost one of the layer stack, where the patterning forms trench electrodes and capacitor dielectrics at alternatingly stacked over the protection dielectric and the semiconductor substrate 850 — Form spacers along sidewalls of the trench electrodes, and then form an etch stop layer and an ILD layer overlying the semiconductor substrate, the protection dielectric layer, the spacers, and the trench electrodes 860 — Form a plurality of vias extending through the ILD layer and the etch stop layer to the trench electrodes

SEMICONDUCTOR TRENCH CAPACITOR STRUCTURE AND MANUFACTURING METHOD THEREOF

PRIORITY CLAIM AND CROSS-REFERENCE

This application is a continuation application of U.S. non-provisional application Ser. No. 18/327,869 filed on Jun. 1, 2023, which is a continuation application and claims the benefit of U.S. non-provisional application Ser. No. 17/461,734 filed on Aug. 30, 2021, now U.S. Pat. No. 11,817,510 B2; the disclosure of which are hereby incorporated by reference in its entirety.

BACKGROUND

Electronic equipment involving semiconductor devices are essential for many modern applications. Technological advances in materials and design have produced generations of semiconductor devices where each generation has smaller and more complex circuits than the previous generation. In the course of advancement and innovation, functional density (i.e., the number of interconnected devices per chip area) has generally increased while geometric size (i.e., the smallest component that can be created using a fabrication process) has decreased. Such advances have increased the complexity of processing and manufacturing semiconductor devices.

Trench capacitors are commonly embedded in integrated passive devices and used in place of ceramic capacitors to reduce the size of mobile devices, reduce the cost of mobile devices, increase the functionality of mobile devices, or any combination of the foregoing. Trench capacitors are usually designed to possess a high aspect ratio in order to achieve a high-density layout. To provide improved characteristics and performance of the trench capacitors, metal-insulator-metal (MIM) capacitor designs comprising a plurality of metal layers and dielectric layers in an interleaved pattern have recently been introduced. When the layers of the MIM capacitors are formed within a recess having a high aspect ratio, the layers may be very thin and the distance between the layers may be short. Accordingly, there may be a greatly increased risk of device cracking due to at least uneven stress and the decreased distance between the layers. Therefore, an improved structure and manufacturing method of trench capacitors are desired.

BRIEF DESCRIPTION OF THE DRAWINGS

Aspects of the present disclosure are best understood from the following detailed description when read with the accompanying Figures. It is emphasized that, in accordance with the standard practice in the industry, various features are not drawn to scale. In fact, the dimensions of the various features may be arbitrarily increased or reduced for clarity of discussion.

FIG. 8 is a flow diagram of a method of manufacturing a semiconductor trench capacitor according to some embodiments of the present disclosure.

DETAILED DESCRIPTION OF THE DISCLOSURE

Figure 1:
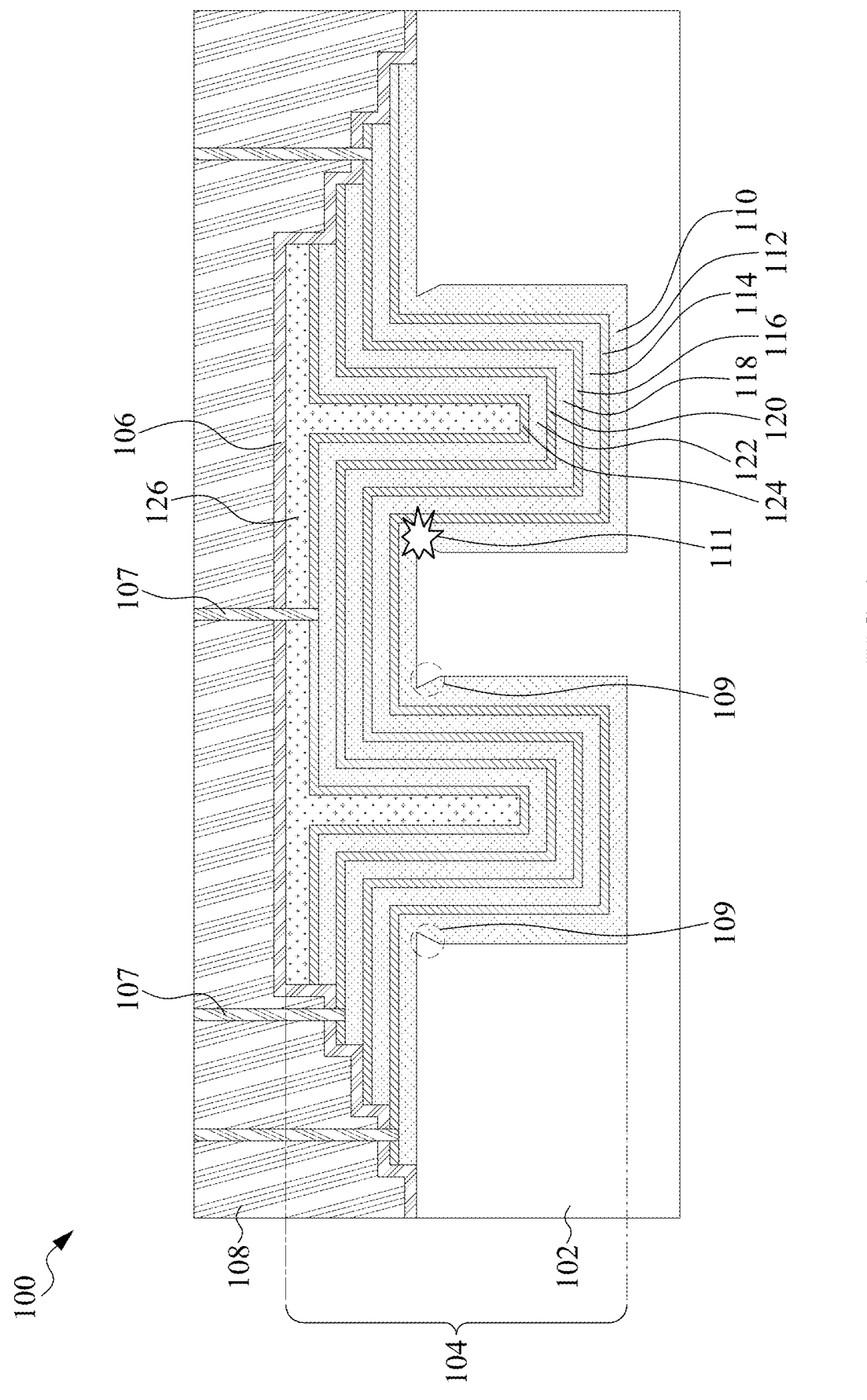
FIG. 1 is a schematic view of a semiconductor trench capacitor structure according to various aspects of a comparative embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the Figures. The spatially relative terms are intended to encompass different orientations of the device in use or operation in addition to the orientation depicted in the Figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, these elements, components, regions, layers and/or sections should not be limited by these terms. These terms may be only used to distinguish one element, component, region, layer, or section from another. The terms such as "first," "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation.

In recent years, the design and manufacturing of on-chip capacitors has experienced rapid progress. This includes the development of deep trench capacitors, which are common in advanced semiconductor circuits and devices. Such deep trench capacitors are usually designed to compose folded and extended electrodes and insulating dielectric materials in order to provide increased capacitance with a reduced die area. Therefore, a trench is created within the capacitor. As the capacitance requirement is increased, the ratio of the capacitor depth to the capacitor width (aka, aspect ratio) would be enlarged accordingly, and hence the created trench would be made deeper. The deeper trench would seek more space along the thickness direction of the wafer rather than the horizontal direction.

In order to provide improved characteristics and performance of the capacitors, metal-insulator-metal (MIM) capacitor designs have recently been introduced in which metal is first deposited on the interior surface of the capacitor trenches, followed by an insulator (preferably a high dielectric constant or "Hi-K" material) and a further metal layer and optionally metal and/or semiconductor material fill. When these layers are formed within a trench having a high depth to width aspect ratio, the layers will be thin due to reduced flux of material precursors due to tight geometry in high aspect ratio structures and increased capacitance can be achieved from the small separation of metal plates across a thin insulator.

FIG. 1 is a schematic view of a semiconductor trench capacitor structure 100 according to various aspects of a comparative embodiment of the present disclosure. As shown in FIG. 1, a trench capacitor 104 overlies a semiconductor substrate 102 and fills a trench (not shown) defined by the semiconductor substrate 102. Further, the trench capacitor 104 comprises multiple electrodes (110, 114, 118, 122, 126) and one or more dielectric layers (112, 116, 120, 124), where the multiple electrodes and the dielectric layers are alternatingly stacked in the trench. The multiple electrodes comprise one or more metal electrodes (110, 114, 118, 122) and a polysilicon electrode 126 stacked over the metal electrodes (110, 114, 118, 122). The semiconductor trench capacitor structure 100 further comprises a plurality of layers and components, e.g., an etch stop layer 106, a plurality of vias 107, and an interlayer dielectric (ILD) layer 108, formed over the trench capacitor 104.

Generally, the trench may have a depth-to-width aspect ratio ranging from about 5:1 to about 100:1. The higher trench aspect ratios are used to help increase the capacitance density of the trench capacitor 104. For deeper trenches (about 1,000 nm or greater), the appearance of deep trench makes the top of deep trench occurring the problem of wedge angles or sharp corners 109 in the process of manufacturing. The stress resulting from the sharp corners 109 and the weight of the multiple layers and components overlying the trench capacitor 104 can produce serious consequence that may lead to the metal electrodes (110, 114, 118, 122) warping or even breaking or cracking (as shown in 111), thereby causes the inefficacy of device.

On the other hand, modern semiconductor devices have continually sought to reduce device size. In addition, the die thickness is also required to be made thinner for portable applications. Thus, the thinned wafer may be more fragile against stress resulting from any manufacturing or packaging process. As a result, metal layer breaking or wafer cracking may occur.

Various embodiments of the present disclosure are directed towards a deep trench capacitor structure with a protection dielectric layer between a semiconductor substrate and a trench MIM capacitor to eliminate the deep trench corner problem and strengthen the structure of the semiconductor structure. An embodiment of a method of forming a deep trench MIM capacitor structure will now be described. The wedge-shaped protruding portion or sharp corner problem caused by deep trenches can be improved accordingly. Therefore, the risk of metal electrodes warping, breaking, or cracking due to foreign stress is effectively eliminated or relieved.

FIG. 2A, FIG. 2B, FIG. 3A, FIG. 3B, FIG. 3C, FIG. 4, FIG. 5, FIG. 6, and FIG. 7 are schematic views of manufacturing a semiconductor trench capacitor structure 200 according to some embodiments of the present disclosure. The semiconductor trench capacitor structure 200 may be, or may be part of, integrated circuit (ICs), integrated passive devices (IPDs), or some other semiconductor structures.

Figure 2A:
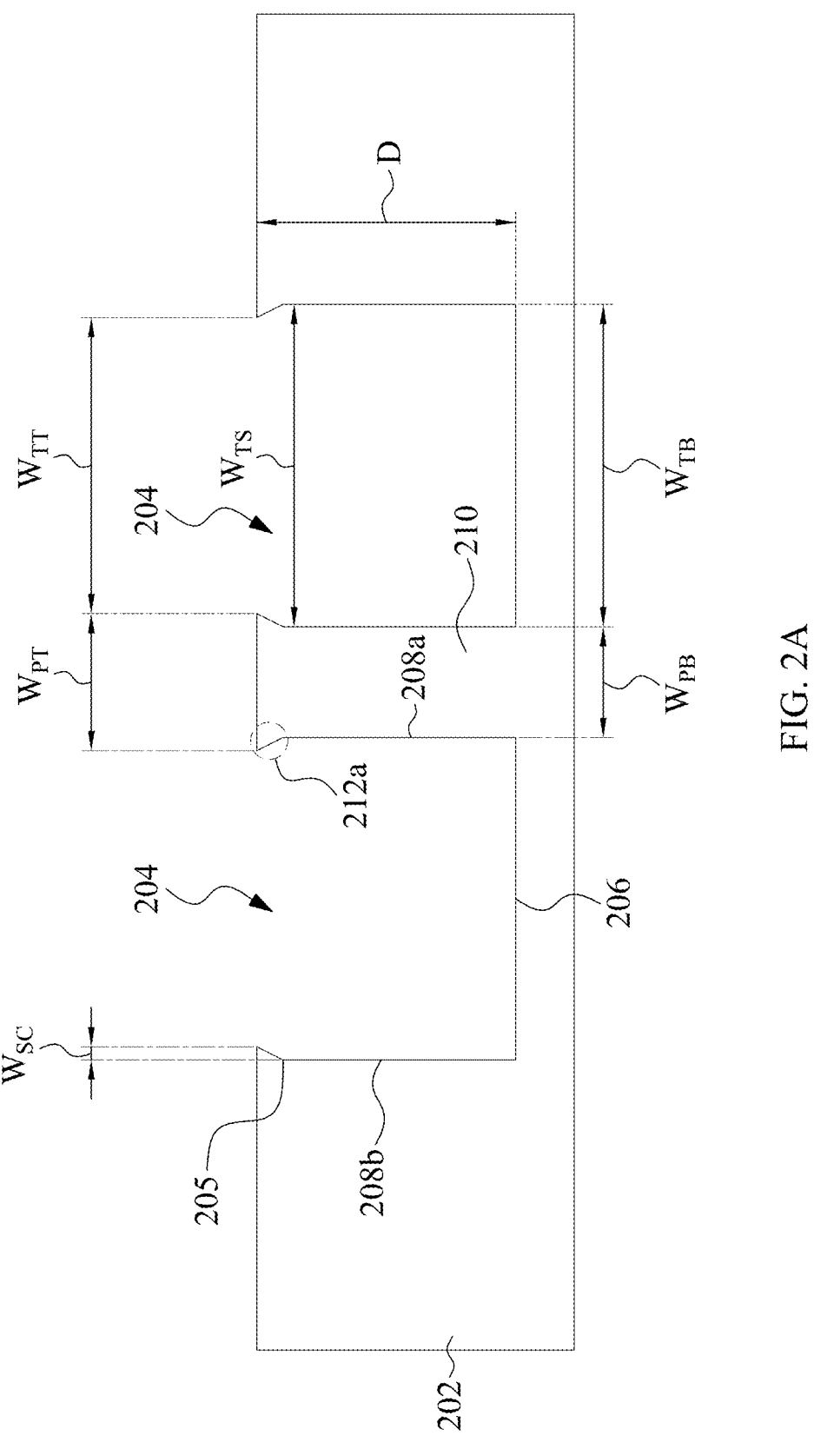
FIG. 2A, FIG. 2B, FIG. 3A, FIG. 3B, FIG. 3C, FIG. 4, FIG. 5, FIG. 6, and FIG. 7 are schematic views of manufacturing a semiconductor trench capacitor structure according to some embodiments of the present disclosure.

As shown in FIG. 2A, a semiconductor substrate 202 is provided. In some embodiments, the semiconductor substrate 202 includes a semiconductor material, such as silicon. In some embodiments, the semiconductor substrate 202 may include other semiconductor materials, such as silicon germanium, silicon carbide, gallium arsenide, or the like. In some embodiments, the semiconductor substrate 202 includes another elementary semiconductor, such as germanium; a compound semiconductor such as silicon carbide; or an alloy semiconductor such as SiGe and GaAsP. In some embodiments, the semiconductor substrate 202 is a semiconductor-on-insulator (SOI). In some embodiments, the semiconductor substrate 202 may include an epitaxial layer, a polysilicon layer, or a semiconductor layer, but is not limited thereto. In some embodiments, the semiconductor substrate 202 is a bare semiconductor substrate. The bare semiconductor substrate is a semiconductor substrate that does not include any layers on the face thereof. In some embodiments, a portion or entire semiconductor substrate 202 may be an amorphous, polycrystalline, or single-crystalline. In some embodiments, the semiconductor substrate 202 may be doped, undoped or contain doped regions and undoped regions therein. In some embodiments, the semiconductor substrate 202 is a relatively undoped or undoped bare substrate.

Referring to FIG. 2A, a plurality of deep trenches 204 are formed in the semiconductor substrate 202. In some embodiments, a process for forming the deep trenches 204 comprises providing a mask (not shown) over the semiconductor substrate 202 with a layout of the deep trenches 204, and subsequently performing an etch (e.g., plasma etch or reactive ion etch) into the semiconductor substrate 202 with the mask in place. In some embodiments, the process for performing the patterning further comprises removing the mask after the etch. The mask may be or comprise, for example, photoresist, silicon oxide, silicon nitride, some other hard mask material, some other mask material, or any combination of the foregoing. In some embodiments in which the mask is a hard mask material, the forming of the mask comprises depositing or growing a hard mask layer over the semiconductor substrate 202, forming a photoresist mask over the hard mask layer, performing an etch into the hard mask layer with the photoresist mask in place, and removing the photoresist mask after the etch.

In some embodiments, the deep trenches 204 have respective bottom portions 206 and respective sidewall surfaces (208a, 208b), and ridges or pillars 210 are arranged between neighboring deep trenches 204. In some embodiments, the deep trenches 204 may have a depth "D" ranging from about 1,000 nm to about 15,000 nm (about 1 μm to about 15 μm), about 3,000 nm to about 13,000 nm, about 4,000 nm to about 11,000 nm, about 4,500 nm to about 10,000 nm, about 6,000 nm to about 9,000 nm, about 7,000 nm to about 8,000 nm, or about 5,000 nm to about 12,000 nm, but is not limited to the above-mentioned values. In some embodiments, the bottom portions 206 of the deep trenches 204 have a width "$W_{TB}$" (bottom width). In some embodiments, the width "$W_{TB}$" ranges from about 10 nm to about 500 nm, about 50 nm to about 300 nm, about 150 nm to about 200 nm, or about 100 nm to about 500 nm, but is not limited to the above-mentioned values. The deep trenches 204 are much deeper than it is wide, having, for example, a depth-to-width aspect ratio ranging from about 5:1 to about 1000:1 or greater, about 10:1 to about 500:1 or greater, or about 20:1 to about 300:1 or greater, but is not limited to the above-mentioned values in some embodiments. For example, the deep trenches 204 can be about 200 nm wide and about 8,000 nm deep, and have an aspect ratio of about 40:1 (deep and narrow trenches), which tends to provide denser capacitor layouts.

Figure 2B:
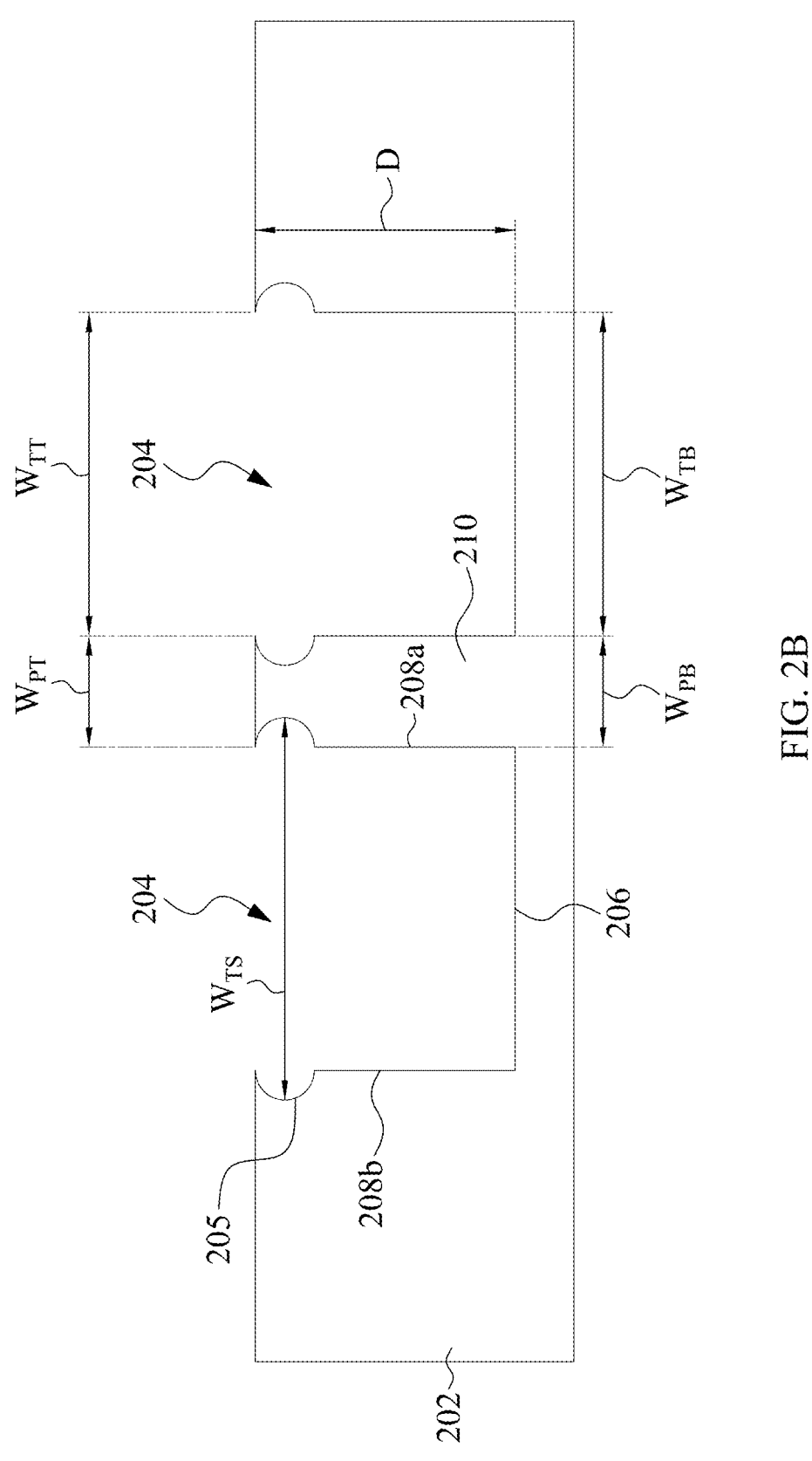

In some embodiments, the sidewalls (208a, 208b) of the deep trenches 204 are not substantially vertical to the semiconductor substrate 202. In some embodiments, the deep trenches 204 include a top portion having a top width ($W_{TT}$) and a bottom portion having a bottom width ($W_{TB}$), and the top width is different from the bottom width. For example, the top width ($W_{TT}$) is less than the bottom width ($W_{TB}$) as shown in FIG. 2A. In some embodiments, the top width ($W_{TT}$) may be greater than the bottom width ($W_{TB}$). In some embodiments, the top width ($W_{TT}$) may be substantially the same as the bottom width ($W_{TB}$) as shown in FIG. 2B. In some embodiments, the sidewalls (208a, 208b) of the deep trenches 204 have notches 205 at a shoulder portion of the deep trenches 204. In some embodiments, the shoulder portion has a shoulder width ($W_{TS}$), which may be the same as or different from the top width ($W_{TT}$) of the deep trenches 204. For example, the shoulder with ($W_{TS}$) may be greater than the top width ($W_{TT}$) of the deep trenches 204. In some embodiments, the notches 205 are recessed into the pillars 210 as shown in FIG. 2B. In some embodiments, a difference between the top width ($W_{TT}$) and the bottom width ($W_{TB}$), may range from about 10 nm to about 200 nm, about 15 nm to about 100 nm, or about 20 nm to about 50 nm, but is not limited to the above values. In some embodiments, a difference between the top width ($W_{TT}$) and the shoulder width ($W_{TS}$), i.e., double width of $W_{SC}$ as shown in FIG. 2A, ranges from about 10 nm to about 300 nm, about 20 nm to about 200 nm, about 30 nm to about 100 nm, or about 50 nm to about 80 nm, or about 40 nm to about 60 nm, but is not limited to the above values.

In some embodiments, the semiconductor substrate 202 defines a plurality of trench segments, i.e., the deep trenches 204, and a plurality of pillar segments, i.e., ridges or pillars 210. The trench segments are separated from each other by the pillar segments. In some embodiments, the pillars 210 are non-rectangular columns. In some embodiments, the pillars 210 have a T-shape, a trapezoid shape, or the like. In some embodiments, each pillar 210 has two wedge-shaped protruding portions or sharp corners (212a, 212b) at a top portion thereof. In some embodiments, the top portions of the sidewalls (208a, 208b) respectively have wedge-shaped protruding portions or sharp corners (212a, 212b). The sharp corners (212a, 212b) defined by the sidewalls (208a, 208b) and the top surface of the semiconductor substrate 202, which are also called trench corners. In some embodiments, the pillars 210 each have a neck portion corresponding to the shoulder portion of the trenches 204. In some embodiments, the pillars 210 have a top surface having a first width ($W_{PT}$), and a bottom surface having a second width ($W_{PB}$). In some embodiments, the top width ($W_{PT}$) may be larger than, substantially the same as, or less than the bottom width ($W_{PB}$). In some embodiments, the first width ($W_{PT}$) is larger than the second width ($W_{PB}$), thereby causing the presence of the sharp corners (212a, 212b). In some embodiments, the first width ($W_{PT}$) is about 10 nm to about 300 nm, about 20 nm to about 200 nm, about 30 nm to about 100 nm, about 50 nm to about 80 nm, or about 40 nm to about 60 nm, but is not limited to the above-mentioned values, larger than the second width ($W_{PB}$). In some embodiments, the wedge-shaped protruding portions or sharp corners (212a, 212b) have a width ($W_{SC}$) ranging from about 5 nm to about 150 nm, about 10 nm to about 80 nm, about 20 nm to about 50 nm, or about 15 nm to about 30 nm, but are not limited to the above-mentioned values. In some embodiments, the wedge-shaped protruding portions or sharp corners (212a, 212b) may extend upwardly, so the top width ($W_{PT}$) may be substantially the same as the bottom width ($W_{PB}$). In some embodiments, the top surface of the pillars 210 is warped at edge portions thereof.

In some embodiments, the sidewalls (208a, 208b) and the bottom surface 206 of the deep trenches 204 are not completely smooth, but rather exhibit a roughness on the order of likely dozens of nanometers. In some embodiments, the deep trenches 204 beneath the sharp corners (212a, 212b), i.e., beneath the shoulder portion, may have a respective uniform width (as in the case of a rectangle or cylinder) or a variable width (for example, in case facing sidewalls have lateral undulations). Generally, a predominant portion (such as more than about 50% of the entire area) of each deep trench 204 may have a width that is sufficient to accommodate vertically-extending portions of all metal electrodes and capacitor dielectric layers to be subsequently formed.

Figure 3A:
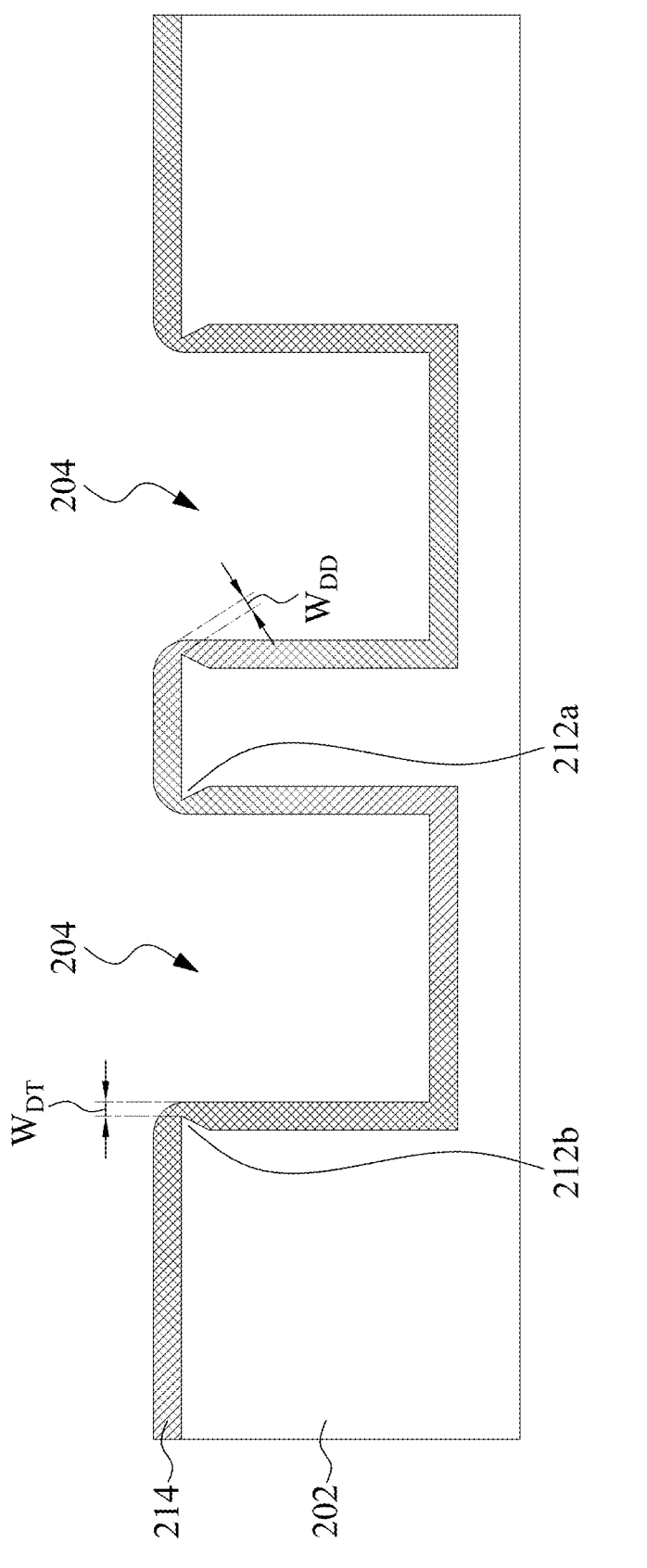

Referring to FIG. 3A, a protection dielectric layer 214 is formed on the physically exposed surface of the semiconductor substrate 202 including the exposed surface of the semiconductor substrate 202 in each of the deep trenches 204. In some embodiments, the protection dielectric layer 214 is formed directly and conformally over the sidewalls (208a, 208b) and the bottom surface 206 of the deep trenches 204 and the top surface of the semiconductor substrate 202. The protection dielectric layer 214 is used as a stress buffer layer to provide stress relief between the sharp corners (212a, 212b) and metal electrodes of the deep trench capacitors to be subsequently formed. The protection dielectric layer 214 is used to tune the stress and provides mechanical strength and rigidity to the deep trench capacitors to be subsequently formed and the semiconductor substrate 202. In some embodiments, the protection dielectric layer 214 can include silicon oxide, silicon nitride, silicon oxynitride, high-density plasma oxide, and/or metal oxide, but is not limited to the above-mentioned materials. In some embodiments, dielectrics such as high k dielectrics (e.g., having a dielectric constant of about 3.9 or greater) can be used. Examples of these include $Al_2O_3$, $ZrO_3$, $HfO_2$, $La_2O_3$, $Ta_2O_5$ and the like. Other suitable materials within the contemplated scope of disclosure may also be used.

In some embodiments, the thickness of the protection dielectric layer 214 should be thick enough to well cover the sharp corners (212a, 212b) of the deep trenches 204. In some embodiments, the protection dielectric layer 214 has a thickness of at least about 100 nm, at least about 150 nm or at least about 200 nm or greater but is not limited to the above-mentioned values. If the thickness of the protection dielectric layer 214 is not thick enough, for example, less than about 100 nm, the sharp corners (212a, 212b) cannot be well covered and thus the stress between the sharp corners (212a, 212b) and the metal electrodes formed thereafter cannot be relieved properly. In some embodiments, the thickness of the protection dielectric layer 214 is uniform. In some embodiments, the thickness of the protection dielectric layer 214 is non-uniform. In some embodiments, the thickest thickness of the protection dielectric layer 214 is about ten times, about five times, or about twice larger the thinnest thickness of the protection dielectric layer 214. In some embodiments, the thinnest thickness of the protection dielectric layer 214 is a horizontal distance ($W_{DT}$) between the tip of the sharp corners (212a, 212b) and a surface of the protection dielectric layer 214 as shown in FIG. 3A. In some embodiments, the protection dielectric 214 has a diagonal thickness ($W_{DD}$)), which is a distance between the tip of the sharp corners (212a, 212b) and a closest corner of the protection dielectric layer 214 to the tip as shown in FIG. 3A. In some embodiments, the protection dielectric layer 214 has a thickness greater than a thickness of each of the trench electrodes to be formed. In some embodiments, the protection dielectric layer 214 has a thickness greater than a half of a thinnest thickness of each of the trench electrodes to be formed. In some embodiments, the diagonal thickness of the protection dielectric layer 214 is twice greater than a thinnest thickness of the trench electrodes. In some embodiments, the diagonal thickness of the protection dielectric layer 214 is greater than a half thickness of each of the trench electrodes to be formed. In some embodiments, the thinnest thickness of the protection dielectric layer 214 is twice greater than a thinnest thickness of each of the trench electrodes to be formed. In some embodiments, the thinnest thickness of the protection dielectric layer 214 is greater than a half thickness of each of the trench electrodes to be formed.

In some embodiments, the formation method of the protection dielectric layer 214 includes chemical vapor deposition (CVD), high-density-plasma chemical vapor deposition (HDP-CVD), low pressure CVD (LPCVD), atmospheric pressure CVD (APCVD), plasma enhanced CVD (PECVD), or combinations thereof, or other suitable methods. In some embodiments, the protection dielectric layer 214 may include a silicon oxide layer formed by thermal oxidation of surface portions of the semiconductor substrate 202 that includes silicon. In some embodiments, the protection dielectric layer 214 may include a silicon carbide layer formed through high temperature furnace melting. In some embodiments, the protection dielectric layer 215 may be formed over a silicon substrate having pillars with sharp corners formed thereon, where the pillars have different materials to the silicon substrate, such as polysilicon, silicon oxide, metals such as AlCu, TiN, TiN and Cu, or other suitable materials.

Figure 3B:
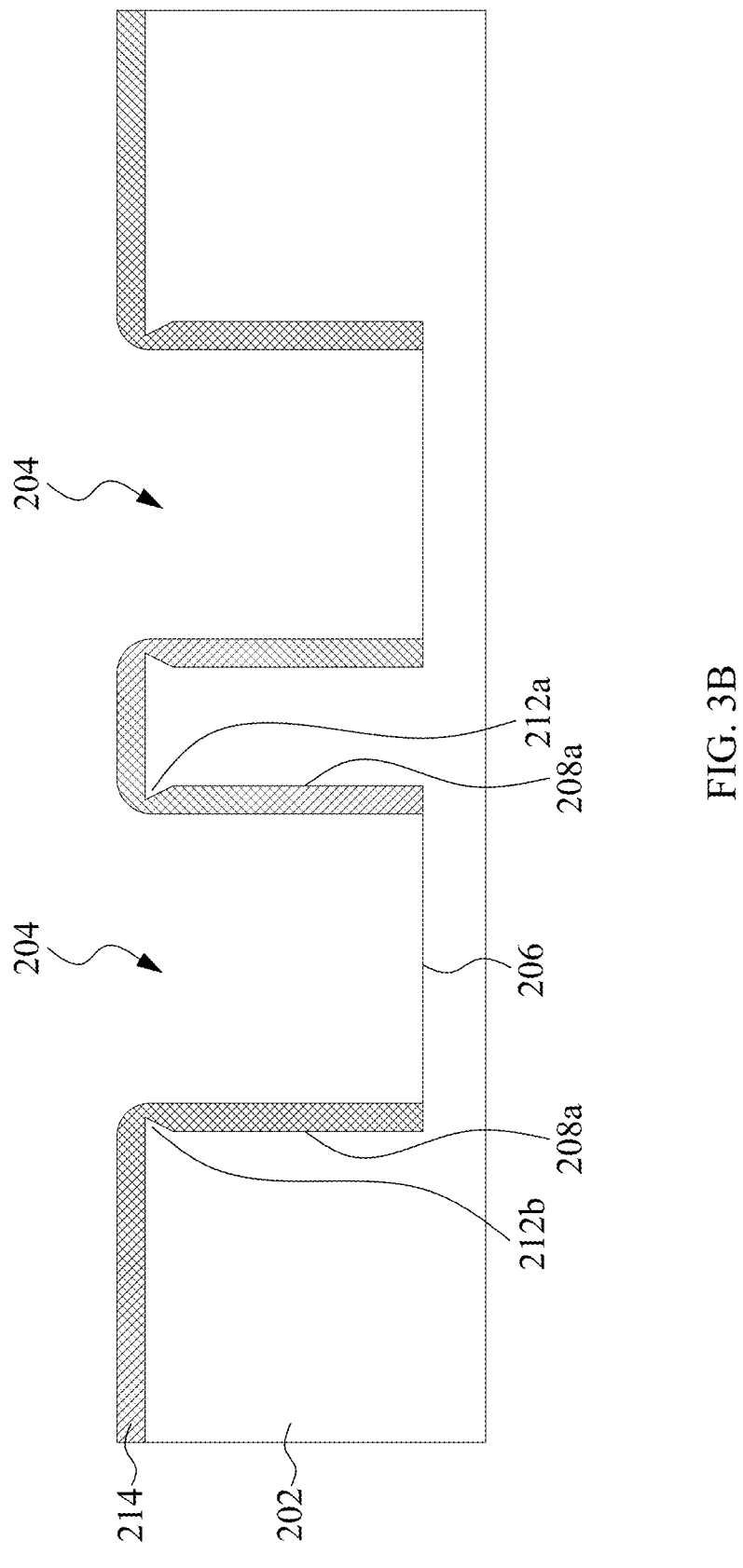
Figure 3C:

FIG. 3B and FIG. 3C show alternative processing embodiments. Referring to FIG. 3B, a protection dielectric layer 214 is partially formed on the physically exposed surface of the semiconductor substrate 202 including the exposed surface of the semiconductor substrate 202 in each of the deep trenches 204. In some embodiments, a protection dielectric layer 214 is formed over the respective sidewalls (208a, 208b) of the deep trenches 204 and the top surface of the semiconductor substrate 202 as shown in FIG. 3B. In some embodiments, the protection dielectric layer 214 is formed directly and conformally over the sidewalls (208a, 208b) of the deep trenches 204 and the top surface of the semiconductor substrate 202. In some embodiments, the bottom surfaces 206 of the deep trenches 204 are exposed and a metal electrode layer can be subsequently deposited thereon. In some embodiments, a protection dielectric layer 214 is formed over the respective sidewalls (208a, 208b) of the deep trenches and a portion of the top surface of the semiconductor substrate 202, so that the sharp corners (212a, 212b) can be covered. In some embodiments, a protection dielectric layer 214 is only formed over the sharp corners (212a, 212b) as shown in FIG. 3C. In some embodiments, prior to forming the protection dielectric layer 214, a portion of the sharp corners (212a, 212b) may be removed by using an isotropic dry etch process. In some embodiments, the thickness of the protection dielectric layer 214 is thick enough to well cover or at least partially cover the sharp corners (212a, 212b).

Figure 4:
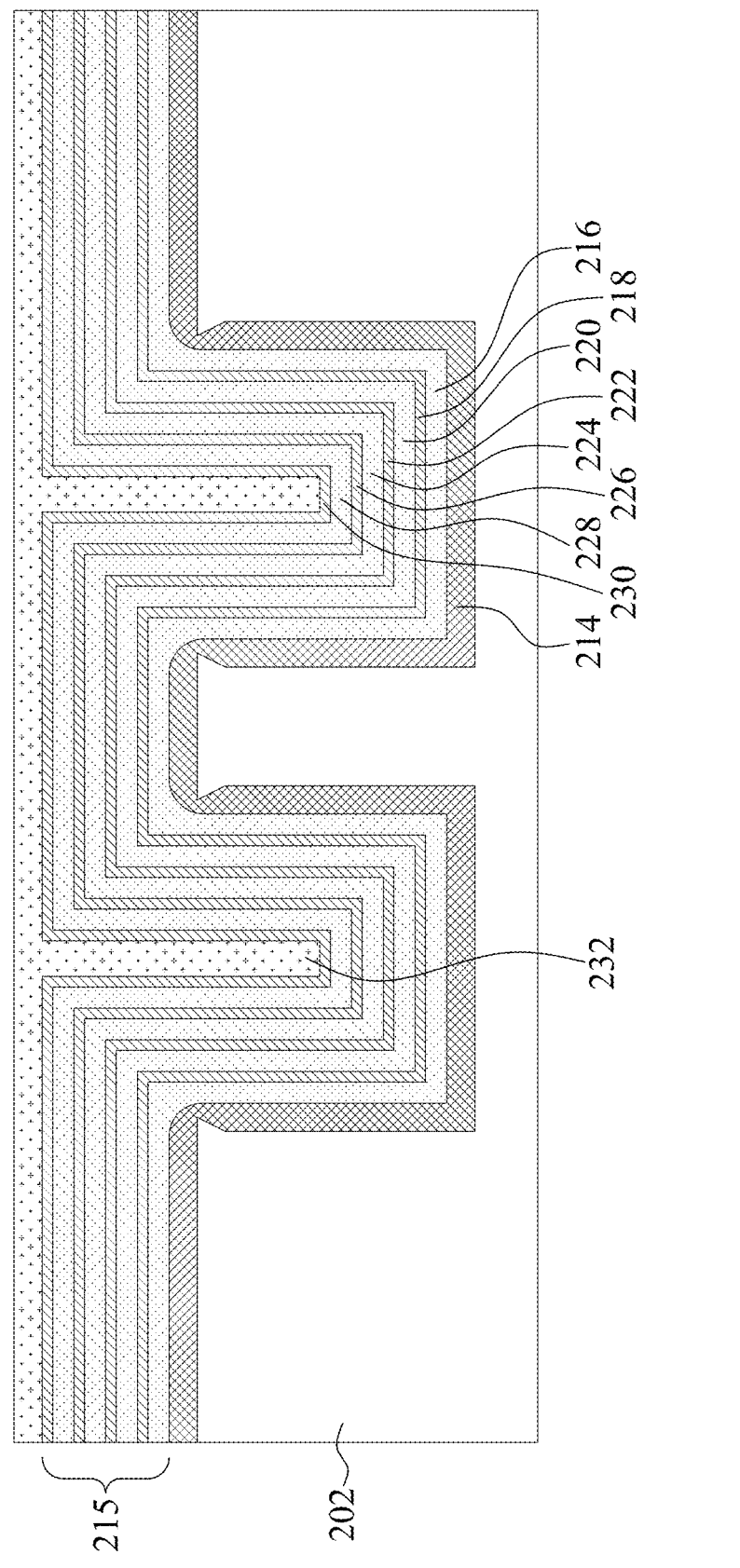

Referring to FIG. 4, an alternating layer stack 215 of metal electrode layers (216, 220, 224, 228) and capacitor dielectric layers (218, 222, 226, 230) is formed over the protection dielectric layer 214 and the semiconductor substrate 202 by a respective conformal deposition process.

Each of the metal electrode layers (216, 220, 224, 228) may include a metallic material. In some embodiments, each metal electrode layers (216, 220, 224, 228) comprises, and/or consists essentially of, a conductive metallic nitride material, which can be a metallic diffusion barrier material. For example, each metal electrode layers (216, 220, 224, 228) can include, and/or can consist essentially of, a conductive metallic nitride material such as TIN, TaN, or WN. Other suitable materials within the contemplated scope of disclosure may also be used. Use of a metallic diffusion barrier material for the metal electrode layers (216, 220, 224, 228) may be advantageous because diffusion of metallic elements through the capacitor dielectric layers (218, 222, 226, 230) and/or through the protection dielectric layer 214 may cause deleterious effects for deep trench capacitors. In some embodiments, the thickness of the protection dielectric layer 214 is thick enough to avoid diffusion of metallic elements.

Each metal electrode layers (216, 220, 224, 228) may be formed by a conformal deposition process such as chemical vapor deposition (CVD) or atomic layer deposition (ALD). In some embodiments, the thickness of each metal electrode layers (216, 220, 224, 228) may be the same or different and in a range from about 5 nm to about 50 nm or about 10 nm to about 20 nm although lesser and greater thicknesses can also be used. In some embodiments, each metal electrode layers (216, 220, 224, 228) may have the same material composition and the same thickness. In some embodiments, each metal electrode layers (216, 220, 224, 228) may have the same material composition but have varying thicknesses. In some embodiments, each metal electrode layers (216, 220, 224, 228) may have different material composition and the same thickness. In some embodiments, each metal electrode layers (216, 220, 224, 228) may have different material composition and different thicknesses. In some embodiments, the thinnest thickness ($W_{DT}$ as shown in FIG. 3A) or diagonal thickness ($W_{DD}$ as shown in FIG. 3A) of the protection dielectric layer 214 is greater than a half thickness of each of the trench electrode layers (216, 220, 224, 228).

As shown in FIG. 4, a plurality of capacitor dielectric layer (218, 222, 226, 230) are formed over the respective metal electrode layers (216, 220, 224, 228). In some embodiments, the capacitor dielectric layers (218, 222, 226, 230) are formed directly and conformally over the respective metal electrode layers (216, 220, 224, 228), although other layers (e.g., liners) can also be arranged between the capacitor dielectric layer (218, 222, 226, 230) and the metal electrode layers (216, 220, 224, 228) in some embodiments. Each of the capacitor dielectric layers (218, 222, 226, 230) is or comprises a high k dielectric material. In some embodiments, the high k dielectric material has a dielectric constant k greater than about 7.9 (which is the dielectric constant of silicon nitride), i.e., a "high-k" dielectric metal oxide material. For example, the capacitor dielectric layers (218, 222, 226, 230) can include a dielectric metal oxide material such as aluminum oxide, hafnium oxide, zirconium oxide, tantalum oxide, lanthanum oxide, an alloy, or a silicate thereof, and/or a layer stack thereof. In some embodiments, the capacitor dielectric layers (218, 222, 226, 230) can include amorphous aluminum oxide layer that can be subsequently annealed into polycrystalline aluminum oxide material after formation of contact via cavities, such as after formation of plate contact via structures. Other suitable materials within the contemplated scope of disclosure may also be used. Each capacitor dielectric layers (218, 222, 226, 230) may be formed by a conformal deposition process such as chemical vapor deposition (CVD) or atomic layer deposition (ALD).

In some embodiments, the thickness of each capacitor dielectric layer (218, 222, 226, 230) may be in a range from about 1 nm to about 20 nm, although lesser and greater thicknesses may also be used. In some embodiments, each capacitor dielectric layer (218, 222, 226, 230) may have the same material composition and the same thickness. In some embodiments, each capacitor dielectric layer (218, 222, 226, 230) may have the same material composition but have varying thicknesses. In some embodiments, each capacitor dielectric layer (218, 222, 226, 230) may have different material composition and the same thickness. In some embodiments, each capacitor dielectric layer (218, 222, 226, 230) may have different material composition and different thicknesses. In some embodiments, each capacitor dielectric layer (218, 222, 226, 230) and the protection dielectric layer 214 may have different material composition and different thicknesses.

Then, the deep trenches 204 are filled with a metal electrode layer 232, such as TiN, to form (serve as) the inner electrode of the deep trench capacitor. In some embodiments, the electrode layer 232 is conductive and may be or comprises metal, doped polysilicon, some other conductive material, or any combination of the foregoing. In some embodiments, the deep trenches 204 fill may be a thin liner of TiN, followed by a thick deposition of polysilicon. Suitable deposition processes such as ALD, or MOCVD (metalorganic CVD) may be employed to deposit these materials. In some embodiments, the metal electrode layer 232 is thicker than the other metal electrode layers (216, 220, 224, 228). In some embodiments, each metal electrode layer (216, 220, 224, 228, 232) may have same or different material composition and same or different thicknesses.

In some embodiments, the total number of the metal electrode layers (216, 220, 224, 228, 232) may be in a range from 3 to 16, such as from 4 to 8. The total number of the capacitor dielectric layers (218, 222, 226, 230) may be one less than the total number of the metal electrode layers. While the present disclosure is described using an embodiment in which the alternating layer stack 215 includes five metal electrode layers (216, 220, 224, 228, 232) and four capacitor dielectric layers (218, 222, 226, 230), embodiments are expressly contemplated herein in which different numbers of metal electrode layers and different numbers of capacitor dielectric layers may be used within the alternating layer stack.

Figure 5:
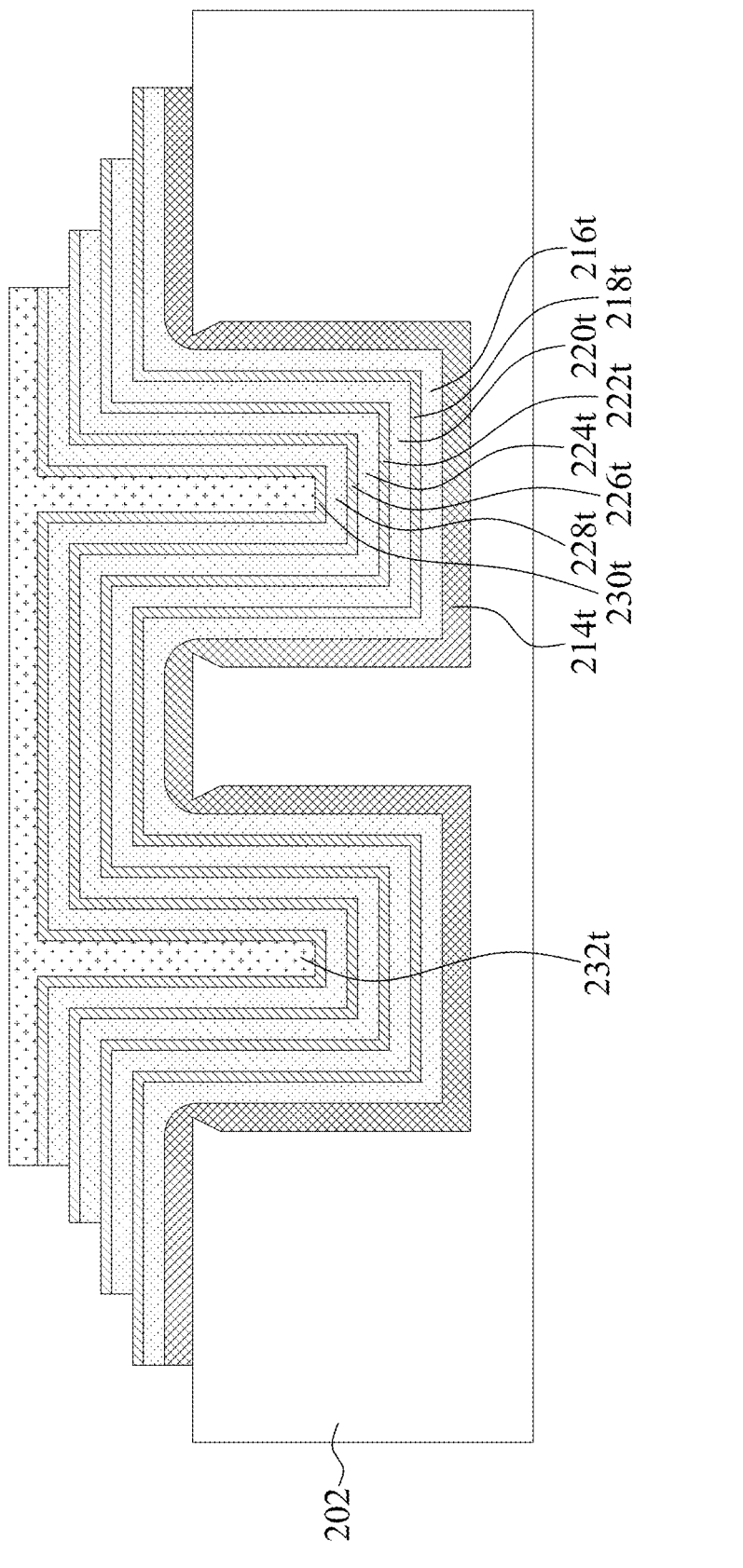

As shown in FIG. 5, the protection dielectric layer 214, the layer stack 215, and the metal electrode layer 232 are patterned one by one from a topmost one of the layers to a bottommost one of the layers. The patterning forms a plurality of trench electrodes (216t, 220t, 224t, 228t, 232t) and a plurality of capacitor dielectric layers (218t, 222t, 226t, 230t) on the semiconductor substrate 202. In some embodiments, the trench electrodes (216t, 220t, 224t, 228t, 232t) increase in width W from a topmost one of the trench electrodes 232t to a bottommost one of the trench electrodes 216t. In some embodiments, each of the trench electrodes (216t, 220t, 224t, 228t, 232t) completely overlies an immediately underlying electrode, and/or is laterally offset from neighboring sidewalls of the immediately underlying electrode.

In some embodiments, the process for performing the patterning of the protection dielectric layer 214, the layer stack 215, and the metal electrode layer 232 comprises performing an etching process individually on each of the layers. For example, the etching process comprises forming a mask (not shown) over the layers with a layout of a trench electrode 232t, a capacitor dielectric 230t, and a trench electrode 228t to be formed, performing an etch into the three layers with the mask in place to form the trench electrode 232t, the capacitor dielectric 230t, and the trench electrode 228t, and removing the mask after the etch. In some embodiments, the mask may be or comprise, for example, photoresist and/or some other mask material. In some embodiments, the etching process is performed as part of a photolithography process.

In some embodiments, the trench electrode 216t, the capacitor dielectric 218t, the trench electrode 220t, the capacitor dielectric 222t, the trench electrode 224t, the capacitor dielectric 226t, the trench electrode 228t, the capacitor dielectric 230t, and the trench electrode 232t collectively define a deep trench capacitor 234. In some embodiments, the deep trench capacitor 234 is a MIM type capacitor. Due to that the protection dielectric 214t is formed between the semiconductor substrate 202 and the deep trench capacitor 234 and for use as a stress buffer layer, and the protection dielectric 214t may have a thickness greater than thicknesses of the trench electrodes (216t, 220t, 224t, 228t, 232t), the sharp corner problem caused by deep trench can be effectively improved and relieved, so that the metal electrodes will not be breaking or cracking, thereby enhancing performance and reliability of the deep trench capacitor 234. In some embodiments, the thinnest thickness of the protection dielectric 214t is larger than the thinnest thickness of the trench electrodes (216t, 220t, 224t, 228t, 232t). In some embodiments, the protection dielectric 214t has a thickness greater than a half thickness of each of the trench electrodes (216t, 220t, 224t, 228t, 232t). In some embodiments, the thinnest thickness of the protection dielectric 214t is at least twice larger than the thinnest thickness of the trench electrodes (216t, 220t, 224t, 228t, 232t).

Figure 6:
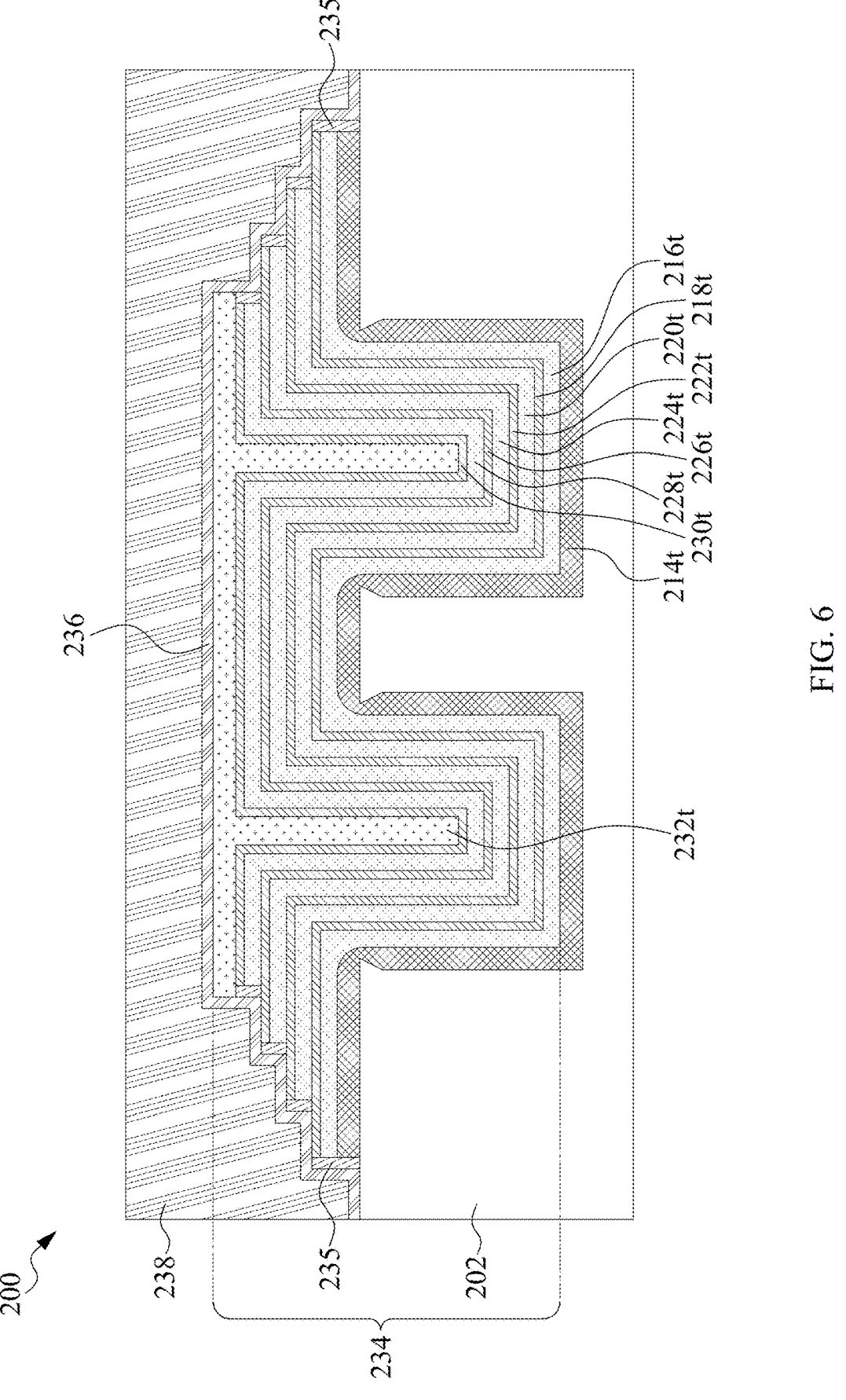

Referring to FIG. 6, a spacer 235 is formed on each sidewall of the trench electrodes (216t, 220t, 224t, 228t). In some embodiments, the spacers 235 are formed by forming an optional spacer liner layer (not shown) and a spacer layer (not shown) overlying and lining the trench capacitor 234, and then etching back the spacer layer to form spacers 235 on sidewalls of the trench electrodes (216t, 220t, 224t, 228t). In some embodiments, the optional liner layer and the spacer layer are formed by conformal deposition and/or are formed by CVD, PVD, ALD, some other deposition process, or any combination of the foregoing. In some embodiments, the etch back comprises applying an etchant to the spacer layer to remove horizontal segments of the spacer layer, while leaving vertical segments of the spacer layer that correspond to the spacers 235. In some embodiments, the spacer liner layer is a different material than the spacer layer and underlies the spacer layer. In some embodiments, the spacer liner layer may be or comprise, for example, silicon oxide and/or some other dielectric material, and the spacer layer may be or comprise, for example, silicon nitride and/or some other dielectric material. In some embodiments the spacer liner layer is patterned to form spacer liners. The spacer liners respectively line the spacers 235, and further separate the spacers 235 from the trench electrodes (216t, 220t, 224t, 228t). In some embodiments, the patterning is performed by continuing the etch back of the spacer layer into the spacer liner layer. In other embodiments, the patterning is performed by an etching process independent of the etch back using the spacers 235 as a mask. In some embodiments, the spacer liner layer may, for example, serve as an etch stop for the etch back. In some embodiments, the spacers 235 are formed on each sidewall of the protection dielectric layer 214t and/or the capacitor dielectric layers (218t, 222t, 226t, 230t).

Referring to FIG. 6, an etch stop layer 236 is formed overlying and lining the trench capacitor 234 and the spacers 235. In some embodiments, the etch stop layer 236 may be or comprise, for example, silicon oxide, silicon nitride, silicon carbide, silicon oxynitride, some other dielectric material, or any combination of the foregoing. The etch stop layer 236 may be formed by conformal deposition and/or formed by CVD, PVD, ALD, some other deposition process, or any combination of the foregoing. In some embodiments, prior to forming the etch stop layer 236, an optional spacer liner layer (not shown) and an optional spacer layer (not shown) may be formed overlying and lining the deep trench capacitor 234. In some embodiments, the spacer liner layer may, for example, serve as an etch stop layer for the subsequent etch back.

Then, an inter-level dielectric (ILD) 238 is formed over the etch stop layer 236. In some embodiments, the ILD layer 238 may be or comprise, for example, silicon dioxide, silicon nitride, silicon carbide, a low k dielectric, some other dielectric material, or any combination of the foregoing. In some embodiments, a process for forming the ILD layer 238 comprises depositing the ILD layer 238 over the etch stop layer 236, and subsequently performing a planarization into the top surface of the ILD layer 238. The deposition may, for example, be performed by CVD, PVD, ALD, some other deposition process, or any combination of the foregoing. The planarization may, for example, be performed by a chemical mechanical polish (CMP) or some other planarization process. In some embodiments, the thickness of the ILD layer 238 can be in a range from about 100 nm to about 500 nm or about 200 nm to about 400 nm, although lesser and greater thicknesses can also be used.

Figure 7:
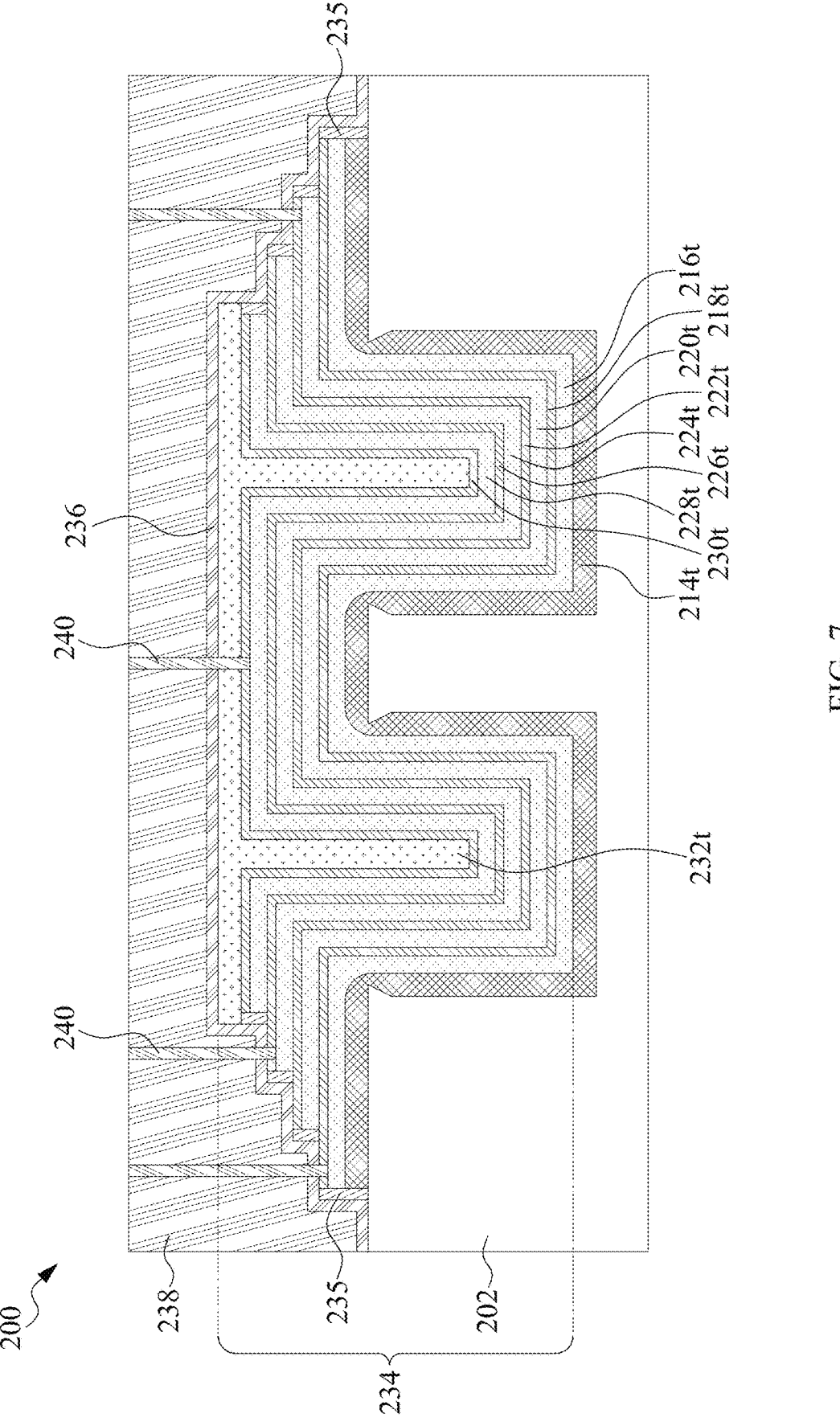

Referring to FIG. 7, a plurality of vias 240 are formed extending through the ILD layer 238 and the etch stop layer 236 to the trench electrodes (216*t*, 220*t*, 224*t*, 228*t*). For ease of illustration, only some of the vias 240 are labeled 240. In some embodiments, the vias 240 may be or comprise, for example, copper, aluminum copper, aluminum, tungsten, some other conductive material, or any combination of the foregoing.

Due to the protection dielectric layer disposed between the semiconductor substrate and the deep trench capacitor for use as a stress buffer layer, the sharp corner problem caused by deep trench can be effectively improved and relieved. Thus, the metal electrodes will not be breaking or cracking, thereby enhancing performance and reliability of the deep trench capacitor. The protection dielectric layer may be thick enough to well cover or at least cover the sharp corners generated due to etching deep trenches. The thick protection dielectric layer can also be used to cover pillars or ridges with sharp corners for preventing neighboring metal layers from breaking or cracking. Therefore, the risk of metal electrodes warping, breaking, or cracking due to foreign stress is effectively eliminated or relieved.

With reference to FIG. 8, a block diagram 800 of some embodiments the method of FIGS. 2-7 is provided.

At 810, a semiconductor substrate is patterned by etching to form a trench in the semiconductor substrate. See, for example, FIG. 2A and FIG. 2B.

At 820, a protection dielectric layer is formed overlying the semiconductor substrate and lining the trench to cover sharp corners caused by the etching. See, for example, FIG. 3A to FIG. 3C.

At 830, a layer stack is formed over the protection dielectric layer and lining the trenches. The layer stack comprises at least two metal electrode layers and at least one capacitor dielectric layer between the electrode layers. The protection dielectric layer has a thickness greater than a half of a thinnest thickness of the metal electrode layers. See, for example, FIG. 4.

At 840, the layers are patterned one by one from a topmost one of the layer stack to a bottommost one of the layer stack, where the patterning forms trench electrodes and capacitor dielectric layers at alternatingly stacked over the protection dielectric and the semiconductor substrate. See, for example, FIG. 5. Because the thick protection dielectric layer disposed between the semiconductor substrate and the deep trench capacitor is for use as a stress buffer layer, the sharp corner problem caused by deep trench can be effectively improved and relieved. Thus, the metal electrodes will not be breaking or cracking, thereby enhancing performance and reliability of the deep trench capacitor.

At 850, spacers are formed along sidewalls of the trench electrodes, and an ILD layer is formed overlying the semiconductor substrate, the protection dielectric layer, the spacers, and the trench electrodes. See, for example, FIG. 6.

At 860, a plurality of vias are formed extending through the ILD layer and the etch stop layer to the trench electrodes. See, for example, FIG. 7.

While the block diagram 800 of FIG. 8 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

The method 800 is merely an example, and is not intended to limit the present disclosure beyond what is explicitly recited in the claims. Additional operations can be provided before, during, and after the method 800, and some operations described can be replaced, eliminated, or moved around for additional embodiments of the method.

In the present disclosure, the protection dielectric layer disposed between the semiconductor substrate and the deep trench capacitor is for use as a stress buffer layer, so the sharp corner problem caused by deep trench can be effectively improved and relieved. The metal electrodes will not be breaking or cracking, thereby enhancing performance and reliability of the deep trench capacitor. The structures and the methods according to various embodiments of the present disclosure can provide a reliable deep trench capacitor with high yield during manufacturing.

In some embodiments, a semiconductor structure is provided. The semiconductor structure comprises a semiconductor substrate; a trench capacitor overlying the semiconductor substrate, wherein the trench capacitor comprises a plurality of trench electrodes and a plurality of capacitor dielectric layers that are alternatingly stacked over the semiconductor substrate and defines a plurality of trench segments and a plurality of pillar segments, wherein the trench electrodes and the capacitor dielectric layers are recessed into the semiconductor substrate at the trench segments, wherein the trench segments are separated from each other by the pillar segments, and wherein sidewalls and a top surface of the pillar segments define a wedge-shaped protruding portion; and a protection dielectric layer disposed between the semiconductor substrate and the trench capacitor, wherein the protection dielectric layer has a thickness greater than a half of a thinnest thickness of the trench electrodes.

In some embodiments, a semiconductor structure is provided. The semiconductor substrate comprises a semiconductor substrate defining a trench, the trench including a top portion having a top width and a shoulder portion having a shoulder width, wherein the top width is less than the shoulder width; a protection dielectric layer overlying the semiconductor substrate and lining the trench; and a trench capacitor overlying the protection dielectric layer and filling the trench, wherein the trench capacitor comprises a first trench electrode overlying the protection dielectric layer and lining the trench; a capacitor dielectric layer overlying the first trench electrode and lining the trench over the first trench electrode; and a second trench electrode overlying the capacitor dielectric layer and filling the trench over the capacitor dielectric layer, wherein the protection dielectric layer has a thinnest thickness greater than a thinnest thickness of the first trench electrode or the second trench electrode.

In some embodiments, a method of forming a semiconductor structure is provided. The method comprises providing a semiconductor substrate; performing an etch into the semiconductor substrate to form a trench, wherein the trench includes a top portion having a top width and a shoulder portion having a shoulder width, wherein the top width is less than the shoulder width; forming a protection dielectric layer overlying the semiconductor substrate and lining the trench; and forming a layer stack including at least two trench electrodes interlaced with a capacitor dielectric layer overlying the protection dielectric layer; wherein the protection dielectric layer has a thickness greater than a half of a thinnest thicknesses of the at least two trench electrodes.

In some embodiments, a semiconductor structure is provided. The semiconductor structure comprises a semiconductor substrate; a trench capacitor on the semiconductor substrate and comprising a plurality of capacitor segments extending into the semiconductor substrate and separated from each other by pillar segments, wherein each pillar segment has a T-shape or a trapezoid shape; and a protection dielectric layer disposed between the capacitor segments and the pillar segments and overlying top surfaces of the pillar segments.

In some embodiments, a semiconductor structure is provided. The semiconductor substrate comprises a semiconductor substrate defining a trench, the trench including a top portion having a top width and a bottom portion having a bottom width, wherein the top width is less than the bottom width; a protection dielectric layer overlying a top surface of the semiconductor substrate and two sidewall surfaces of the trench; and a trench capacitor disposed over the semiconductor substrate and filling the trench, wherein the trench capacitor comprises a first trench electrode layer overlying the semiconductor substrate and lining the trench; a capacitor dielectric layer overlying the first trench electrode layer and lining the trench over the first trench electrode layer; and a second trench electrode layer overlying the capacitor dielectric layer and filling the trench over the capacitor dielectric layer, wherein the protection dielectric layer has a thinnest thickness greater than a thinnest thickness of the first trench electrode layer or the second trench electrode layer.

In some embodiments, a method of forming a semiconductor structure is provided. The method comprises providing a semiconductor substrate; performing an etch into the semiconductor substrate to form a trench, wherein the trench includes a top portion having a top width and a bottom portion having a bottom width, wherein the top width is less than the bottom width; forming a protection dielectric layer overlying a top surface of the semiconductor substrate and two sidewall surfaces of the trench; and forming a layer stack including at least two trench electrode layers interlaced with a capacitor dielectric layer over the semiconductor substrate and filling the trench; wherein the protection dielectric layer has a thickness greater than a half of a thinnest thicknesses of the at least two trench electrode layers.

In some embodiments, a semiconductor structure is provided. The semiconductor structure comprises a semiconductor substrate; a metal-insulator-metal (MIM) trench capacitor on the semiconductor substrate and comprising a plurality of capacitor segments extending into the semiconductor substrate and separated from each other by pillar segments, wherein each pillar segment has a T-shape or a trapezoid shape, and has two sharp corners at a top portion, and two sidewalls beneath the two sharp corners and perpendicular to the semiconductor substrate; and a protection dielectric layer disposed over the two sharp corners of the pillar segments, so that the sidewalls of the pillar segments are in contact with a metal layer of the MIM trench capacitor.

In some embodiments, a semiconductor structure is provided. The semiconductor substrate comprises a semiconductor substrate defining a trench, the trench including a top portion having a top width and a bottom portion having a bottom width, wherein the top width is less than the bottom width such that the semiconductor substrate comprises two sharp corners at a top portion thereof; a discontinuous protection dielectric layer completely overlying the two sharp corners of the semiconductor substrate; and a trench capacitor disposed over the semiconductor substrate and filling the trench, wherein the trench capacitor comprises: a first trench electrode layer overlying the semiconductor substrate and lining the trench; a capacitor dielectric layer overlying the first trench electrode layer and lining the trench over the first trench electrode layer; and a second trench electrode layer overlying the capacitor dielectric layer and filling the trench over the capacitor dielectric layer, wherein the protection dielectric layer has a thinnest thickness greater than a thinnest thickness of the first trench electrode layer or the second trench electrode layer.

In some embodiments, a method of forming a semiconductor structure is provided. The method comprises providing a semiconductor substrate; performing an etch into the semiconductor substrate to form a trench, wherein the trench includes a top portion having a top width and a bottom portion having a bottom width, wherein the top width is less than the bottom width such that the semiconductor substrate comprises two sharp corners at a top portion thereof; forming a discontinuous protection dielectric layer completely overlying the two sharp corners of the semiconductor substrate; and forming a layer stack including at least two trench electrode layers interlaced with a capacitor dielectric layer over the semiconductor substrate and filling the trench; wherein the protection dielectric layer has a thickness greater than a half of a thinnest thicknesses of the at least two trench electrode layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a semiconductor substrate;
a metal-insulator-metal (MIM) trench capacitor on the semiconductor substrate and comprising a plurality of capacitor segments extending into the semiconductor substrate and separated from each other by pillar segments, wherein each pillar segment has a T-shape or a trapezoid shape, and has two sharp corners at a top portion, and two sidewalls beneath the two sharp corners and perpendicular to the semiconductor substrate; and
a protection dielectric layer disposed over the two sharp corners of the pillar segments, so that the sidewalls of the pillar segments are in contact with a metal layer of the MIM trench capacitor.

2. The semiconductor structure of claim 1, wherein the protection dielectric layer is a discontinuous protection dielectric layer.

3. The semiconductor structure of claim 1, wherein the thickness of the protection dielectric layer is non-uniform.

4. The semiconductor structure of claim 3, wherein the thickest thickness of the protection dielectric layer is about twice larger the thinnest thickness of the protection dielectric layer.

5. The semiconductor structure of claim 1, wherein the protection dielectric layer completely overlies the two sharp corners of the pillar segments.

6. The semiconductor structure of claim 1, wherein the protection dielectric layer is disposed discontinuously and at least covers the two sharp corners of the pillar segments.

7. The semiconductor structure of claim 1, wherein each capacitor segment comprises an alternative stack of trench electrode layers and capacitor dielectric layers.

8. The semiconductor structure of claim 7, wherein the protection dielectric layer has a thickness greater than a half of a thinnest thickness of each of the trench electrode layers.

9. The semiconductor structure of claim 7, wherein the lowest trench electrode layer is in direct contact with the semiconductor substrate.

10. The semiconductor structure of claim 7, wherein the lowest trench electrode layer is in direct contact with the sidewalls of the pillar segments of the MIM trench capacitor.

11. The semiconductor structure of claim 7, wherein lowest trench electrode layer is in direct contact with top surfaces of the pillar segments of the MIM trench capacitor.

12. A semiconductor structure, comprising:
a semiconductor substrate defining a trench, the trench including a top portion having a top width and a bottom portion having a bottom width, wherein the top width is less than the bottom width such that the semiconductor substrate comprises two sharp corners at a top portion thereof;
a discontinuous protection dielectric layer completely overlying the two sharp corners of the semiconductor substrate; and a trench capacitor disposed over the semiconductor substrate and filling the trench, wherein the trench capacitor comprises:
a first trench electrode layer overlying the semiconductor substrate and lining the trench;
a capacitor dielectric layer overlying the first trench electrode layer and lining the trench over the first trench electrode layer; and
a second trench electrode layer overlying the capacitor dielectric layer and filling the trench over the capacitor dielectric layer,
wherein the protection dielectric layer has a thinnest thickness greater than a thinnest thickness of the first trench electrode layer or the second trench electrode layer.

13. The semiconductor structure of claim 12, wherein the protection dielectric layer partially overlies the semiconductor substrate and the trench.

14. The semiconductor structure of claim 12, wherein the first trench electrode layer is in direct contact with the semiconductor substrate.

15. The semiconductor structure of claim 12, wherein the first trench electrode layer is in direct contact with a bottom surface and two sidewall surfaces of the trench.

16. The semiconductor structure of claim 12, wherein the thickness of the protection dielectric layer is non-uniform.

17. The semiconductor structure of claim 16, wherein the thickest thickness of the protection dielectric layer is about twice larger the thinnest thickness of the protection dielectric layer.

18. A method of forming a semiconductor device, the method comprising:
providing a semiconductor substrate;
performing an etch into the semiconductor substrate to form a trench, wherein the trench includes a top portion having a top width and a bottom portion having a bottom width, wherein the top width is less than the bottom width such that the semiconductor substrate comprises two sharp corners at a top portion thereof;
forming a discontinuous protection dielectric layer completely overlying the two sharp corners of the semiconductor substrate; and
forming a layer stack including at least two trench electrode layers interlaced with a capacitor dielectric layer over the semiconductor substrate and filling the trench;
wherein the protection dielectric layer has a thickness greater than a half of a thinnest thicknesses of the at least two trench electrode layers.

19. The method of claim 18, wherein the thickness of the protection dielectric layer is non-uniform, and a thinnest thickness of the protection dielectric layer is twice greater than the thinnest thickness of the at least two trench electrode layers.

20. The method of claim 18, wherein the lower trench electrode layer is in direct contact with a bottom surface and two sidewall surfaces of the trench.

* * * * *